US 6,653,182 B2

United States Patent
Marty et al.

(10) Patent No.: US 6,653,182 B2
(45) Date of Patent: Nov. 25, 2003

(54) PROCESS FOR FORMING DEEP AND SHALLOW INSULATIVE REGIONS OF AN INTEGRATED CIRCUIT

(75) Inventors: Michel Marty, Saint Paul De Varces (FR); Hélène Baudry, Grenoble (FR); François Leverd, St-Ismier (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 09/898,540

(22) Filed: Jul. 3, 2001

(65) Prior Publication Data

US 2002/0014676 A1 Feb. 7, 2002

(30) Foreign Application Priority Data

Jul. 4, 2000 (FR) .............................. 00 08686

(51) Int. Cl.⁷ .......................................... H01L 21/8238
(52) U.S. Cl. ....................................... 438/208
(58) Field of Search ................. 438/219, 221, 438/225, 295, 294, 296, 292, 424–427, 220, 202, 208

(56) References Cited

U.S. PATENT DOCUMENTS

| 5,358,891 A | 10/1994 | Tsang et al. | 437/67 |
| 6,214,696 B1 * | 4/2001 | Wu | 438/424 |
| 6,303,413 B1 * | 10/2001 | Kalnitsky et al. | 438/151 |
| 6,448,124 B1 * | 9/2002 | Coolbaugh et al. | 438/202 |

FOREIGN PATENT DOCUMENTS

EP 2000049296 2/2000

OTHER PUBLICATIONS

Wolf., (Silicon Processing for the VLSI Era, vol. 1, pp. 57–58).*

IBM Technical Disclosure Bulletin, "Process for Simultaneously Forming Poly/EPI Silicon Filled Deep and Shallow Isolation Trenches Having a CVD Oxide Cap, " vol. 33, No. 7, pp. 388–392, Dec. 1990.

L. Fonseca, F. Campabadal, B. Garrido, J. Samitier, "A Reliability Comparison of RTO and Furnace Thin $SiO_2$ Layers: Effect of the Oxidation Temperature," Microelectronic Engineering 40, pp. 61–75, 1998.

French Preliminary Search Report dated Apr. 4, 2001 for French Application No. 0008686.

* cited by examiner

Primary Examiner—David Nelms
Assistant Examiner—Quol Hoang
(74) Attorney, Agent, or Firm—Lisa K. Jorgenson; Jon A. Gibbons; Fleit, Kain, Gibbons, Gutman & Bongini & Bianco P.L.

(57) ABSTRACT

Prior fabricating the transistors, a phase of forming a deep insulative trench in the substrate is followed by a phase of forming a shallow insulative trench in the substrate and extending the deep trench. The phase of forming the deep trench includes coating the inside walls of the deep trench with an initial oxide layer and filling the deep trench with silicon inside an envelope formed from an insulative material. The phase of forming the shallow trench includes coating the inside walls of the shallow trench with an initial oxide layer and filling the shallow trench with an insulative material.

16 Claims, 5 Drawing Sheets

PROCESS FOR FORMING DEEP AND SHALLOW INSULATIVE REGIONS OF AN INTEGRATED CIRCUIT

CROSS REFERENCE TO RELATED APPLICATIONS

This application is based upon and claims priority from prior French Patent Application No. 0008686, filed Jul. 4, 2000, the disclosure of which is hereby incorporated by reference in its entirety.

BACKGROUND OF THE INVENTION

1. Field of the Invention

The present invention generally relates to the field of integrated circuits and more particularly to forming insulative regions for electrically isolating bipolar and biCMOS transistors, especially transistors for radio frequency applications.

2. Description of Related Art

Deep insulative trenches formed all around a bipolar transistor significantly reduce the collector/substrate capacitance in radio frequency applications. The maximum frequency of oscillation of the transistors is inversely proportional to the square root of the collector/substrate capacitance.

During the fabrication of MOS and bipolar transistors, deep trenches are excavated into the substrate of the integrated circuit. These deep trenches are often filled with an insulative material that flows well into the trench. The flow of insulative material into the trench reduces the problems of mechanical stresses, because the high temperature heat treatments to fabricate the transistors have already been carried out.

The use of deep insulative trenches in the substrate although useful is not without it shortcomings. One shortcoming is the formation of insulative trenches outside the contact areas, in particular outside the base contact area. The formation of contact areas outside the base contact area increases the length of the insulative trench. This results in an increased collector/substrate capacitance and a larger overall size of the transistor, and therefore a lower level of integration.

Accordingly a need exists for a method to fabricate a circuit with insulative trenches that overcomes the prior art problems and shortcomings of reducing collector/substrate capacitances while minimizing the size of the overall transistor.

Mixed bipolar and MOS transistors (biCMOS technology) are useful in many different applications. The formation of insulative trenches in biCMOS technology is known. For example in bipolar transistors, the surfaces are isolated from other components by LOCOS insulative regions, as is well known to the persons of average skill in the art LOCOS insulative regions also isolate the extrinsic collector from the base region.

On the other hand, MOS transistors are insulated on the surface by shallow insulative trenches. Forming the shallow insulative regions requires heat treatment at very high temperatures. In particular the very high temperatures are used to soften the corners of the trenches. This process of using very high temperatures to soften corners prevent dislocations in the silicon of the active area, which would cause a leakage current. The combination of trench isolation techniques used in bipolar and MOS transistors presents a problem.

Accordingly a need exists for a method to permit the fabrication of mixed bipolar and MOS transistors with shallow insulative trench.

SUMMARY OF THE INVENTION

The present invention provides a method to form deep insulative trenches around bipolar transistors at the beginning of the process, i.e. before the transistors are fabricated, in order to be able to reduce the distance between the deep insulative trenches and the active area of the transistors and thereby reduce the collector/substrate capacitance, while allowing a higher level of integration because of a smaller overall size.

The present invention forms insulative regions that are totally compatible with the biCMOS technology, i.e. for the simultaneous fabrication of bipolar transistors and MOS transistors. In this regard, the present invention enables mixed insulative regions to be made, i.e. regions made up of deep trenches surmounted by shallow trenches also made at the beginning of the process.

The invention therefore proposes a method of forming an insulative region within a substrate of an integrated circuit including transistors.

In accordance with one general feature of the invention, the method includes, before fabricating the transistors, a phase of forming a deep insulative trench in the substrate followed by a phase of making a shallow insulative trench in the substrate which is nosier the surface and extends the deep trench. The phase of forming the deep trench (or "surface", to use a somewhat strained term to contrast with "deep") includes coating the inside walls of the trench with an initial oxide layer, for example a silicon dioxide layer, obtained by rapid thermal oxidation and filling the trench with silicon inside an envelope formed from an insulative material for example a layer of tetraethyl orthosilicate (TEOS) oxide. The phase of forming the shallow trench also includes coating the inside walls of the trench with an initial oxide layer obtained by rapid thermal oxidation and filling the trench with an insulative material.

Rapid thermal oxidation (RTO) minimizes the thermal balance and consequently prevents layers buried in the substrate rising by diffusion.

Another advantage of the method according to the invention is the high mechanical strength of the structure obtained. Rapid thermal oxidation softens the corners of the trenches, which would otherwise constitute areas of stress concentration leading to the onset of dislocations.

Moreover, as explained in more detail later, rapid thermal oxidation avoids the formation of a cup at the edge of the shallow trench during successive etching operations. These cups lead to the formation of a spurious transistor at the corner of the active area, and this leads to a lack of homogeneity of the threshold voltage of the transistor in the active area, the voltage being higher at the center than at the edge, and this increases the leakage currents of the transistor as a whole.

Filling the deep trench with a semiconductor material similar to that of the substrate. Semiconductor material such as silicon or polycrystalline has been shown to work advantageously well for the present invention and minimizes the problems of expansion during subsequent heat treatment at high temperatures to fabricate the transistors.

Rapid thermal oxidation is advantageously carried out for not more than approximately 150 seconds and at a temperature of not more than 1,150° C.

In one embodiment of the invention, the phase of forming the deep trench includes:
 a) etching the substrate to form a deep cavity in the substrate;
 b) coating the inside walls of the cavity with the initial thermal oxide layer;
 c) depositing a second insulative layer on the structure obtained in step b);
 d) depositing a silicon layer on the structure obtained in step c);
 e) mechanically/chemically polishing the silicon layer as far as the second oxide layer;
 f) etching the upper part of the silicon present in the trench as far as the level of the upper surface of the substrate; and
 g) partially etching the second insulative layer to an etching depth substantially equal to the depth of the shallow trench.

The phase of forming the shallow trench advantageously includes:
 a) etching the upper part of the substrate to form a shallow cavity whose bottom is substantially at the same level as the boundary of the second insulative layer in the underlying deep trench;
 b) de-oxidation of the inside walls of the cavity;
 c) coating the inside walls of the cavity with the initial thermal oxide layer;
 d) filling the coated cavity with the insulative material; and
 e) mechanically/chemically polishing the insulative material.

The invention also provides an integrated circuit including insulative regions for separating transistors within a semiconductor substrate.

According to one general feature of the invention, at least one insulative region includes a deep insulative trench opening into a shallow insulative trench filled with an insulative material, the deep trench containing silicon separated from the inside walls of the trench by an insulative material.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION OF AN EMBODIMENT

Figure 1:
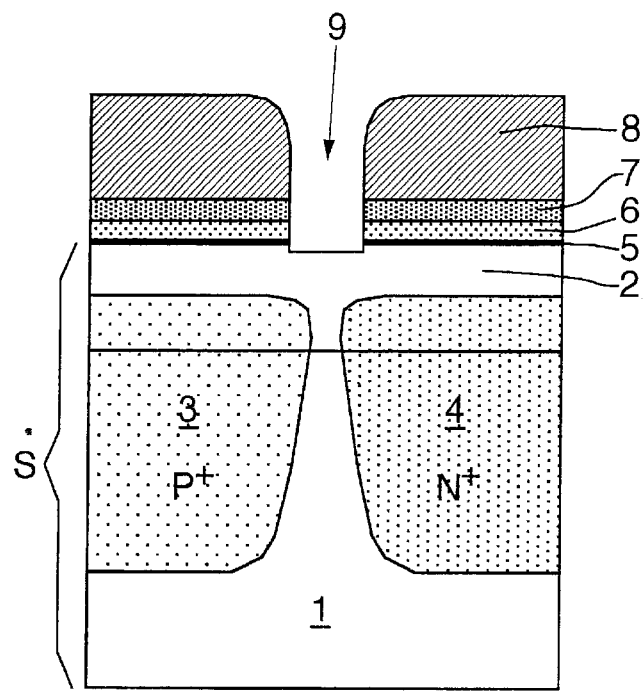
FIGS. 1 to 8 are diagrams illustrating the main steps of one embodiment of a method according to the present invention.

However, it should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

In the drawing like numerals refer to like parts through several views.

FIG. 1 shows a silicon semiconductor substrate 1, for example of the P type. $P^+$-doped and $N^+$-doped buried layers 3 and 4 are implanted on the silicon substrate. A layer 2 of N silicon typically 1 micron thick is then grown epitaxially.

The buried layer 4 provides a buried connecting layer between the extrinsic collector well of the bipolar transistor to be made subsequently and the intrinsic collector that will be formed on top of the layer 4 in the epitaxially grown layer 2. This is standard practice in the art. Similarly, a bipolar transistor with the opposite type of conductivity can be made using the buried layer 3.

In the resulting substrate S (formed of the initial substrate 1 surmounted by the epitaxially grown layer 2) a deep insulative trench is first formed between the buried areas 3 and 4.

A sacrificial oxide layer or buffer layer 5, usually referred to by persons of average skill in the art as the "Padox" layer, is formed on the top surface of the substrate S, typically by growing silicon dioxide. The thickness of the Padox layer is typically of the order of 50 Å to 200 Å, for example 70 Å.

A layer 6 of silicon nitride $Si_3N_4$, for example, is then deposited on the buffer layer 5, typically by chemical vapor-phase deposition (CVD). The thickness of the layer 6 is of the order of 100 nm to 200 nm, for example 160 nm.

A layer 7 of tetraethyl orthosilicate (TEOS) oxide having a thickness of the order of 300 nm, for example, is then deposited on the silicon nitride layer 6 to form a hard mask. The layer 7 is deposited conventionally, for example by the CVD process.

A resin layer 8 is then deposited, in a manner known in the art, and is then exposed and developed, also in a manner known in the art, to define the characteristics of the surroundings of the opening 9 of the future deep trench (the opening 9 of the block of resin corresponds to the opening of the trench).

After exposing and developing the resin block, the stacked layers 5, 6 and 7 are etched and the silicon of the layer 2 overetched. These standard etching operations are known in the art. For example, the etching process is generally the plasma etching process and uses a plasma formed of $C_4F_8$, $O_2$, argon, CO to etch the TEOS oxide and a plasma formed of $CHF_3$, $O_2$ and argon to form the nitride layer.

Figure 2:
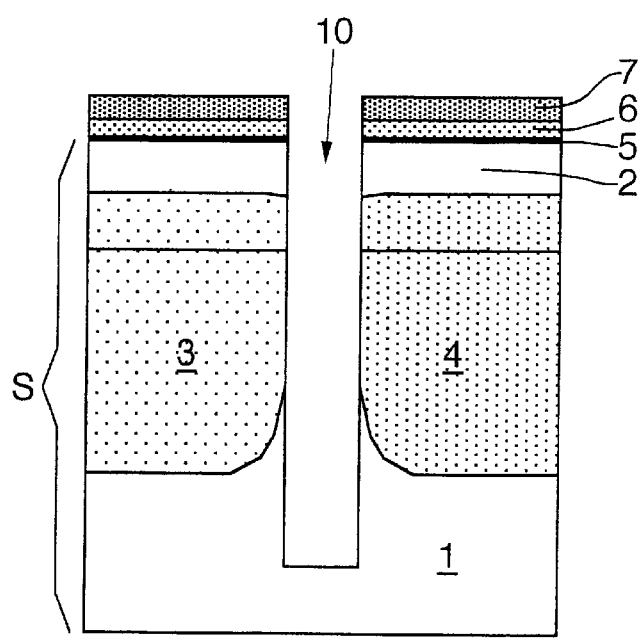

Turning now to FIG. 2, the resin mask 8 is then removed in a standard way that is known in the art. Next the substrate S is etched using the TEOS oxide layer 7 as a hard mask, to form in the substrate a deep cavity 10 that will later form the deep insulative trench. This etching is usually preceded by cleaning the structure with HBr and is typically a plasma etching step using a plasma of $SF_6$, HBr, $O_2$.

The depth of the cavity 10 from the top surface of the substrate (top surface of the layer 2) is typically of the order of 5 microns and its width of the order of 0.8 microns.

Figure 3:
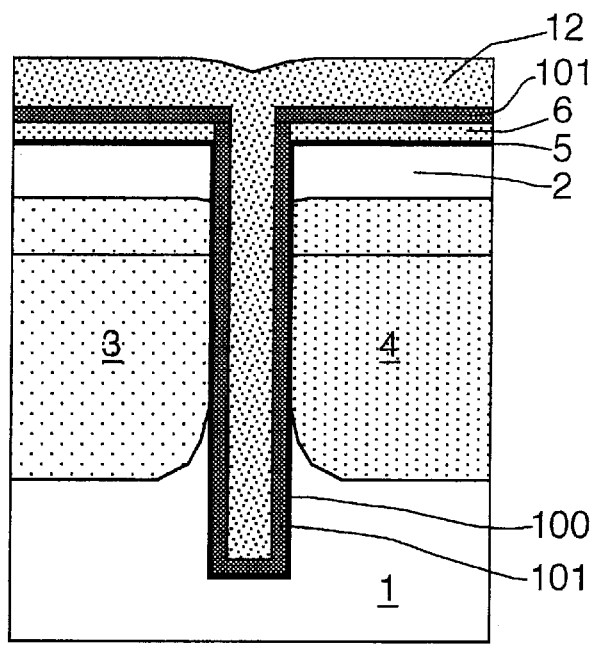

The oxide mask 7 is then chemically etched in the standard way as far as the silicon nitride layer 6.
As shown in FIG. 3, the inside walls of the cavity 10 are then oxidized by rapid thermal oxidation to form a silicon dioxide layer 100 typically of the order of 5 nm thick.

Rapid thermal oxidation is known to the person of average skilled in the art but until now has been used to form MOS transistor gate oxides.

Rapid thermal oxidation entails heating by radiation (for example using halogen lamps) in an oxidizing atmosphere (for example oxygen or water vapor) in a suitable chamber. The maximum temperature does not exceed 1,150° C. and is typically in the range from 600° C. to 1,100° C.

Heating is extremely rapid, typically taking from 15 seconds to 60 seconds, and not exceeding about 120 seconds to 150 seconds.

The temperature must also rise and fall rapidly in the chamber. The rate of change can be 75° C./s, for example, with 8-inch semiconductor wafers, or 50° C./s with 6-inch semiconductor wafers.

The inside walls of the cavity 10 are oxidized at a temperature from 800° C. to 1,000° C. for less than one minute.

The thermal oxide layer 100 formed in this way prevents leakage currents along the trench and avoids any shrinking of the silicon under the sacrificial oxide layer 5.

Rapid thermal oxidation is particularly advantageous when used for the purposes of the present invention, since its thermal budget is much more stable than that of standard oxidation in a furnace. This prevents the buried layers 3 and 4 rising towards the surface of the substrate by diffusion.

A TEOS oxide layer 101 is then deposited on the structure obtained in the preceding step in a furnace. The thickness of the layer 101 is typically of the order of 150 nm. The layer 101 also covers the silicon nitride layer 6.

The layer 101 also contributes to the insulative function of the trench and additionally limits the capacitance of the insulative trench when formed and filled with polycrystalline silicon as further described below.

To be more precise, after depositing the layer 101, a polycrystalline silicon layer 12 is deposited at low temperature. The polycrystalline silicon then fills the interior of the insulative envelope formed by the vertical parts of the layer 101.

The thickness of the layer 12 is typically of the order of 400 nm.

The polysilicon layer 12 is then polished mechanically and chemically as far as the oxide layer 101. The polysilicon is then etched, for example using an $SF_6$ plasma, until the level of the polysilicon 120 in the cavity 10 is much the same as the level of the top surface of the substrate S. The layer 101 is then chemically etched in the standard way to an etching depth such that the boundary of the residual oxide layer 101 corresponds closely to the depth of the shallow trench to be formed.

Figure 4:
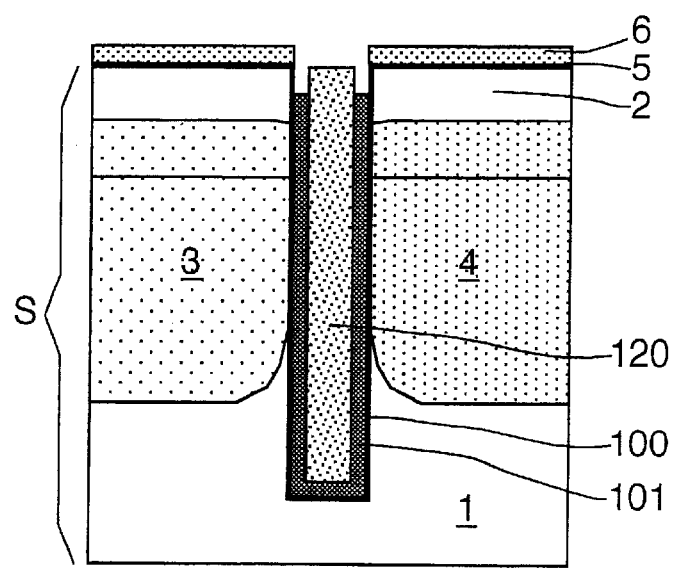
Figure 5:
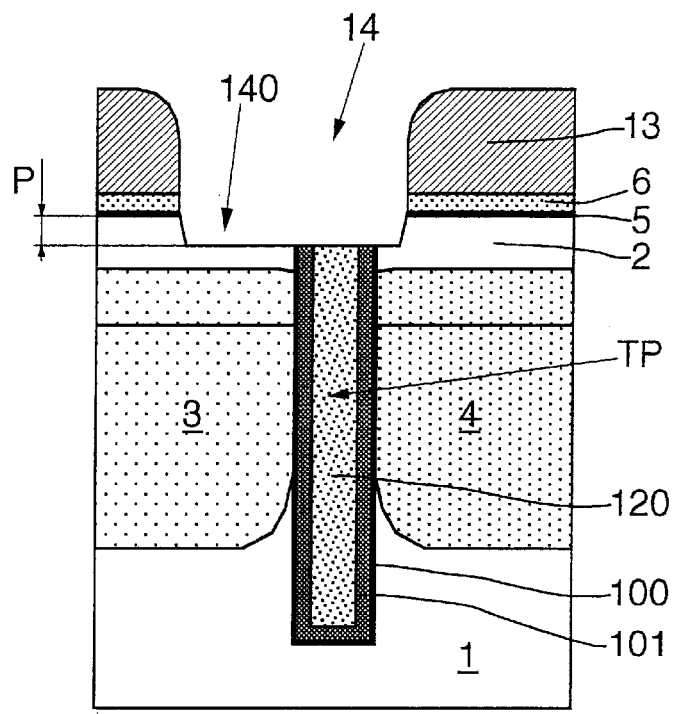

In the structure obtained in this way, which is shown in FIG. 4, a block of resin 13 as shown in FIG. 5, is used in the conventional way to define the opening 14 corresponding to the opening of the shallow trench to be formed. The nitride layer 6 in the opening 14 is then etched through the opening 14 in the conventional way to a depth P of the order of 0.36 micron, for example, to form a shallow surface cavity 140 in the substrate extending the deep trench TP previously formed.

The resin 13 is then removed in the standard way, followed by de-oxidation to remove from the top of the deep trench TP some of the thermal oxide layer 100 and some of the TEOS oxide layer 101. The structure thus obtained is then subjected to further rapid thermal oxidation, typically at 1,050° C. for one minute, to form a thermal oxide layer 15 on the walls of the cavity 140 and on top of the polycrystalline silicon filling the deep trench TP.

Note that, because of the undercutting of the TEOS oxide layer 101, the top of the polycrystalline silicon 120 can expand without generating stresses during this oxidation treatment.

The rapid thermal oxidation that forms the silicon dioxide layer 15 also has the advantage of softening the corners of the silicon at the edge of the cup, which minimizes the onset of dislocation in the silicon.

Finally, rapid thermal oxidation, as well as preventing the buried layers rising towards the surface, oxidizes a part of the silicon nitride layer 6. This has the advantage of forming silicon nitride outside the cavity 140 and therefore outside the shallow trench to be formed.

Figure 6:
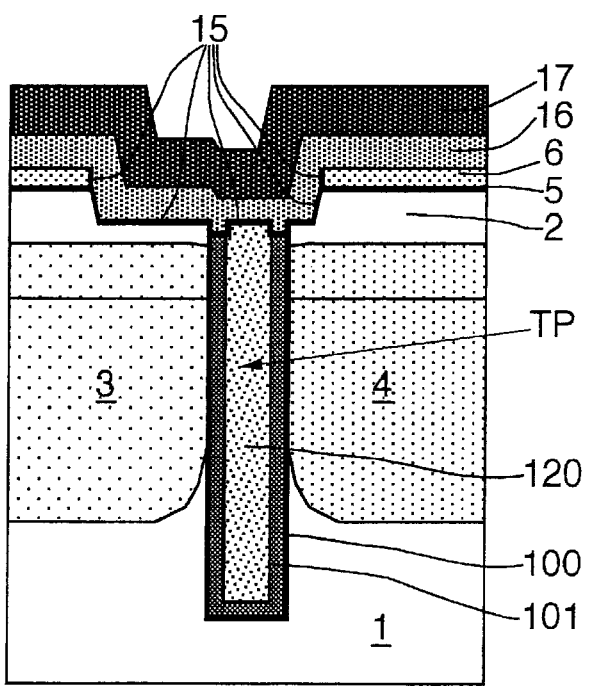

The person of average skill in the art is aware that some of the oxide is consumed during subsequent de-oxidation treatment, in particular during fabrication of the transistors. However, it is still possible to avoid the formation of a depression in the shallow trench at the edge of the active area of the transistor, which prevents the formation of a spurious transistor in the corner of the active area. The risk of this kind of depression appearing would have been greater in the absence of the oxide portion 15 at the extremity of the nitride layer 6 as shown in FIG. 6.

The thickness of the oxide layer 15 is of the order of 25 nm, for example. The cavity 140 is then filled with an insulative material. To be more precise, the insulative material 16 is silicon dioxide, which is deposited anisotropically by means of a high-density plasma in a plasma chamber, in a manner that is known in the art, is less dense than the grown silicon oxide, and typically has a thickness of the order of 400 nm to 550 nm.

TEOS oxide 17 is then deposited in a furnace, using a method known in the art, typically to a thickness of the order of 300 nm to 500 nm, for example 300 nm.

Figure 7:
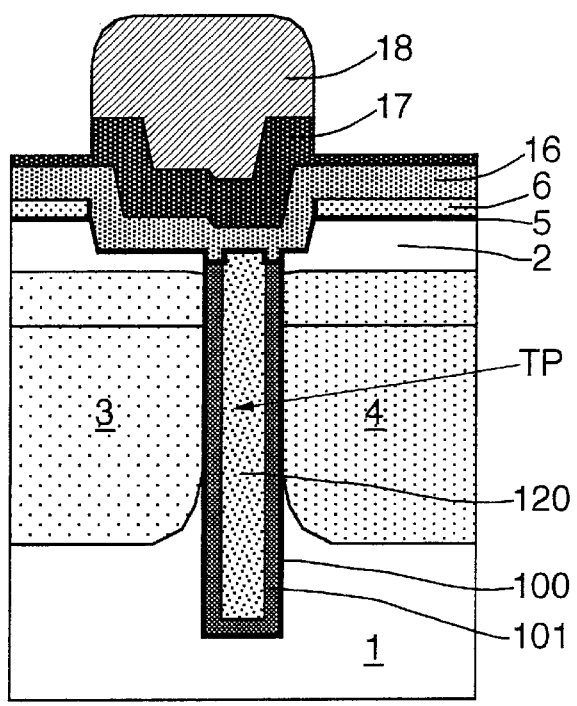

After densification annealing, a resin block 18 as shown in FIG. 7 is formed on the upper surface of the oxide 17 and the oxide is etched using the resin block as a mask.

After removing the resin block, the insulative material is flattened by mechanical/chemical polishing as far as the nitride layer 6.

The nitride layer 6 is then removed by etching, as known in the art.

After this step of removing the nitride layer it is usual to effect de-oxidation and oxidation phases, in particular de-oxidation to remove the sacrificial oxide (Padox) layer 5, followed by oxidation of the semiconductor block to form a sacrificial oxide layer, in the active areas in particular, usually referred to by the person of average skilled in the art as the "Sacox" layer. This oxidation precedes the various implantations of dopants and further de-oxidation to remove the Sacox (sacrificial oxide) layer before forming the gate oxide layer (for MOS transistors) on the active areas and fabricating the bipolar transistors.

Figure 8:
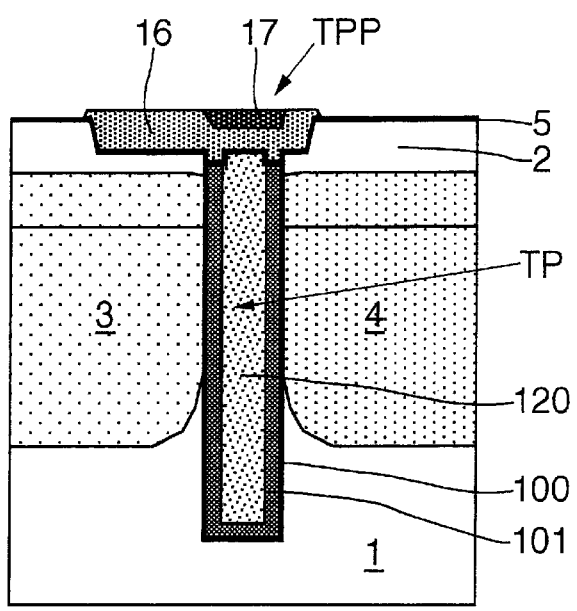

These de-oxidation steps consume some of the insulative material from the trench and result in the profile of the shallow trench TPP shown in FIG. 8. Note that the profile of the insulative material filling the shallow trench TPP does not have any depression relative to the level of the upper surface of the substrate. As already explained, this is due in particular to the presence of the oxidized part of the nitride layer 6.

Figure 9:
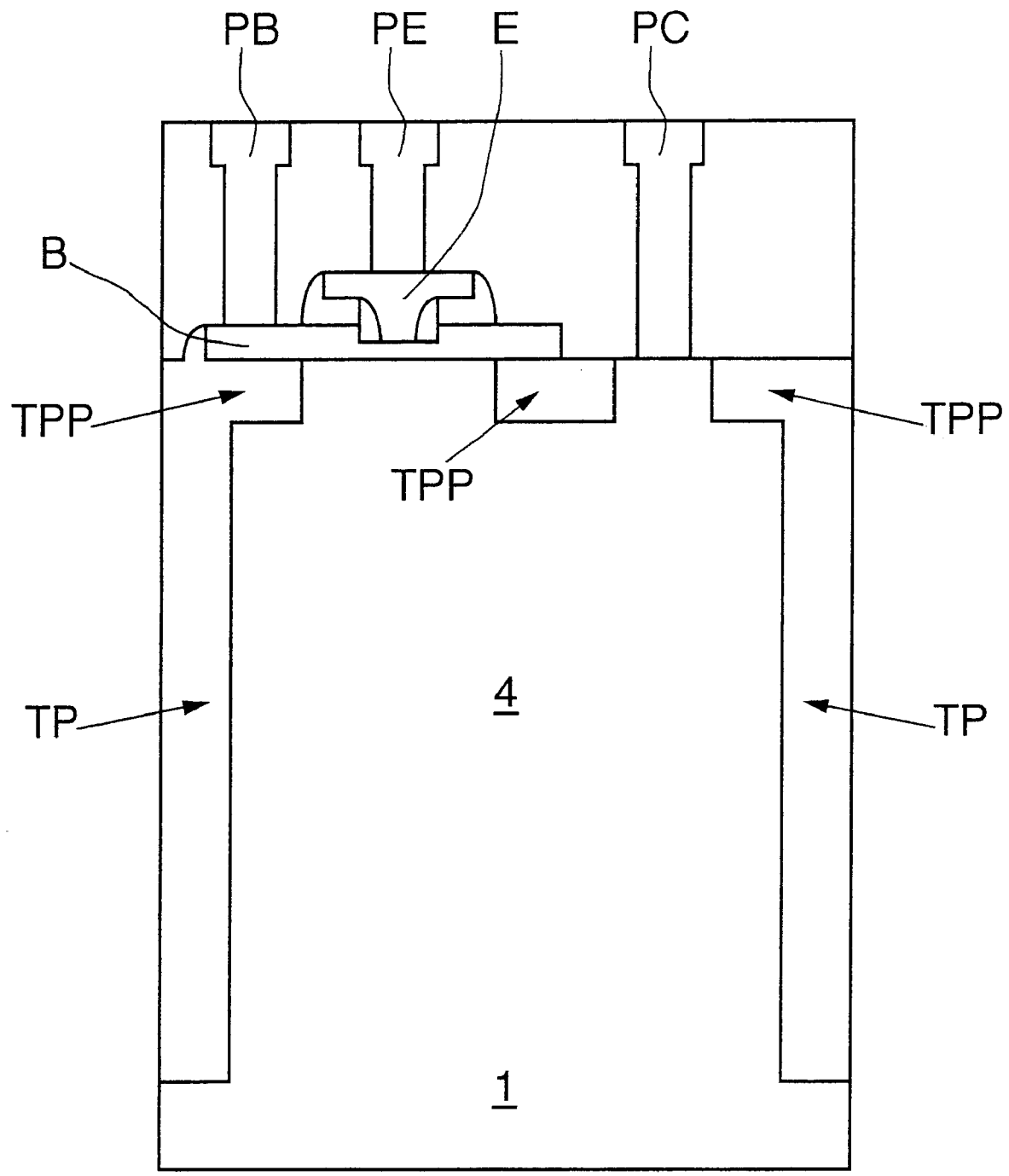
FIG. 9 is a diagram illustrating a bipolar transistor fabricated on an active area surrounded by mixed insulative regions (deep trenches and shallow trenches) made by a method according to another embodiment of the present invention.

The bipolar transistor is then fabricated in the standard way and the final result is a structure like that shown in FIG. 9, for example.

To be more precise, the buried layer 4 is surrounded by insulative regions formed of deep trenches TP opening into shallow trenches TPP. The shallow trenches TPP are made conjointly with the other shallow trenches and in particular separate the intrinsic collector from the offset extrinsic collector well on which the collector terminal PC is formed.

The ends of the base B of the bipolar transistor rest on two adjacent shallow trenches. The base terminal PB is formed at the end of the extrinsic base resting on the shallow trench TPP extending the deep trench TP. Finally, an emitter block E rests on the intrinsic base and supports an emitter terminal PE.

The person of average skill in the art will have noted that fabricating the transistor after forming the deep and shallow trenches means that the deep trenches can be nearer the buried layer 4 and the base terminal PB can be virtually on top of a deep trench TP. The overall size of the transistor is therefore reduced relative to a standard transistor fabricated before forming the deep trenches. The deep trench, if formed at the end of the process, would be shifted laterally outside the base terminal PB, so increasing the collector/substrate capacitance and the overall size of the transistor.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A method of forming an insulative region within a substrate of an integrated circuit prior to fabricating one or more transistors, the method comprising the steps of:

forming through a top surface of a substrate a deep insulative trench with an inside wall;

coating the inside wall of the deep insulative trench with a first oxide layer formed by rapid thermal oxidation so that the coating forms an envelope;

coating a second oxide layer on the first oxide layer;

filling the deep insulative trench with silicon on top of the second oxide layer;

forming a shallow insulative trench on the upper surface of the substrate, after the deep insulative trench is totally formed, wherein the shallow insulative trench includes an inside wall and a bottom, the bottom at substantially a same level as the second oxide layer;

coating the inside walls of the shallow insulative trench with a first oxide layer obtained by rapid thermal oxidation; and filling the shallow insulative trench with an insulative material.

2. A method according to claim 1, wherein the step of coating the inside wall of the deep insulative trench with a first oxide layer obtained by rapid thermal oxidation is carried out for less than 150 seconds and at a temperature of less than 1,150° C.

3. A method according to claim 1, wherein the step of coating the inside wall of the shallow insulative trench with a first oxide layer obtained by rapid thermal oxidation is carried out for less than 150 seconds and at a temperature of less than 1,150° C.

4. The method according to claim 1, wherein the step of forming the deep insulative trench further comprises the steps of:

etching the substrate to form a deep cavity with an inside wall in the substrate;

polishing off the silicon up to the second oxide layer;

etching the silicon deposited in the deep cavity to a depth substantially equal to the upper surface of the substrate; and partially etching the second oxide layer to a depth substantially equal to a depth of the shallow insulative trench.

5. The method according to claim 4, wherein the step of depositing a second oxide layer on top of the first oxide layer includes depositing a second oxide layer of tetracthyl orthosilicate (TEOS) oxide.

6. The method according to claim 4, wherein the step of depositing a second oxide layer on top of the first oxide Layer includes depositing a second oxide layer of tetraethyl orthosilicate (TEOS) oxide with approximately a 400 nm thickness.

7. The method according to claim 1, wherein the step of coating the inside wall of the deep insulative trench with a first oxide layer includes coating the inside wall with a silicon dioxide layer.

8. The method according to claim 1, wherein the step of coating the inside wall of the deep insulative trench with a first oxide layer includes coating the inside wall with a silicon dioxide layer with approximately 5 nm thickness.

9. A method of forming an insulative region for separating transistors within a substrate of an integrated circuit prior to fabricating one or more transistors, the method comprising the steps of:

etching a substrate with an upper surface to form a deep trench with an inside wall therein;

coating the inside wall of the deep trench within an initial thermal oxide layer formed by rapid thermal oxidation;

depositing a second insulative layer on the initial thermal oxide layer;

depositing silicon on top of the second insulative layer so as to fill the deep trench;

etching the upper surface of the substrate to form a shallow trench after the deep trench is formed, wherein the shallow trench includes an inside wall and a bottom, the bottom at substantially a same level as the second insulative layer;

coating the inside walls of the shallow insulative trench with an initial thermal oxide layer; and filling the shallow insulative trench with an insulative material.

10. The method according to claim 9, wherein the step of coating the inside wall of the deep trench with an initial thermal oxide layer includes coating the inside wall of the deep trench within an initial thermal oxide layer using rapid thermal oxidation carried out for less than 150 seconds and at a temperature of less than 1,150° C.

11. The method according to claim 9, wherein the step of coating the inside wall of the shallow trench within an initial thermal oxide layer includes coating the inside wall of the shallow trench with an initial thermal oxide layer using rapid thermal oxidation.

12. The method according to claim 9, wherein the step of coating the inside wall of the shallow insulative trench with an initial thermal oxide layer includes coating the inside wall of the deep trench within an initial thermal oxide layer using rapid thermal oxidation.

13. The method according to claim 9, wherein the stop of coating the inside wall of the deep insulative trench with a initial thermal oxide layer includes coating the inside wall with a silicon dioxide layer.

14. The method according to claim 9, wherein the step of coating the inside wall of the deep insulative trench with a initial thermal oxide layer includes coating the inside wall with a silicon dioxide layer with approximately 5 nm thickness.

15. The method according to claim 9, wherein the step of depositing a second insulative layer on top of the initial thermal oxide layer includes depositing a second insulative layer of tetraethyl orthosilicate (TEOS) oxide.

16. The method according to claim 9, wherein the step of depositing a second insulative layer on top of the initial thermal oxide layer includes depositing a second insulative layer of tetraethyl orthosilicate (TEOS) oxide with approximately a 400 nm thickness.

* * * * *